(12) United States Patent
Chen et al.

(10) Patent No.: US 11,094,673 B2
(45) Date of Patent: Aug. 17, 2021

(54) STACKED DIE PACKAGE WITH CURVED SPACER

(71) Applicant: Western Digital Technologies, Inc., San Jose, CA (US)

(72) Inventors: Kuan-Cheng Chen, Taichung (TW); Pao-Yi Huang, Taichung (TW); Jing-Wei Hsu, Changhua (TW)

(73) Assignee: Western Digital Technologies, Inc., San Jose, CA (US)

( * ) Notice: Subject to any disclaimer, the term of this patent is extended or adjusted under 35 U.S.C. 154(b) by 27 days.

(21) Appl. No.: 16/692,652

(22) Filed: Nov. 22, 2019

(65) Prior Publication Data

US 2021/0159214 A1 May 27, 2021

(51) Int. Cl.
*H01L 25/065* (2006.01)
*H01L 23/498* (2006.01)
*H01L 25/00* (2006.01)
*H01L 23/00* (2006.01)

(52) U.S. Cl.
CPC .... *H01L 25/0657* (2013.01); *H01L 23/49811* (2013.01); *H01L 24/45* (2013.01); *H01L 25/50* (2013.01); *H01L 2225/0651* (2013.01); *H01L 2225/06506* (2013.01)

(58) Field of Classification Search
CPC ... H01L 2225/0651; H01L 2225/06506; H01L 24/45; H01L 24/48; H01L 25/50; H01L 25/0657; H01L 23/49811; H01L 2224/48247
See application file for complete search history.

(56) References Cited

U.S. PATENT DOCUMENTS

| 2009/0166887 A1* | 7/2009 | Upadhyayula | .......... H01L 24/83 257/777 |
| 2015/0221624 A1* | 8/2015 | Ye | ........................ H01L 24/49 257/777 |

* cited by examiner

*Primary Examiner* — Jasmine J Clark
(74) *Attorney, Agent, or Firm* — Volpe Koenig

(57) ABSTRACT

Apparatuses and techniques include a substrate, a controller die mounted on the substrate, fingers electrically connecting the controller die to the substrate, a spacer mounted on the substrate adjacent to the controller die, and a first memory die mounted on the spacer. The first memory die is attached to a top surface of the spacer. The spacer has a curved edge facing the controller. The curved edge may have a first curve including a first curve apex extending away from the controller, a first curve peak on one side of the first curve apex, and a second curve peak on an opposite side of the first curve apex than the first curve peak. Additional fingers connect the controller and the first memory die at a point that is aligned with the space between the first curve and a line extending from the first curve peak and the second curve peak.

19 Claims, 13 Drawing Sheets

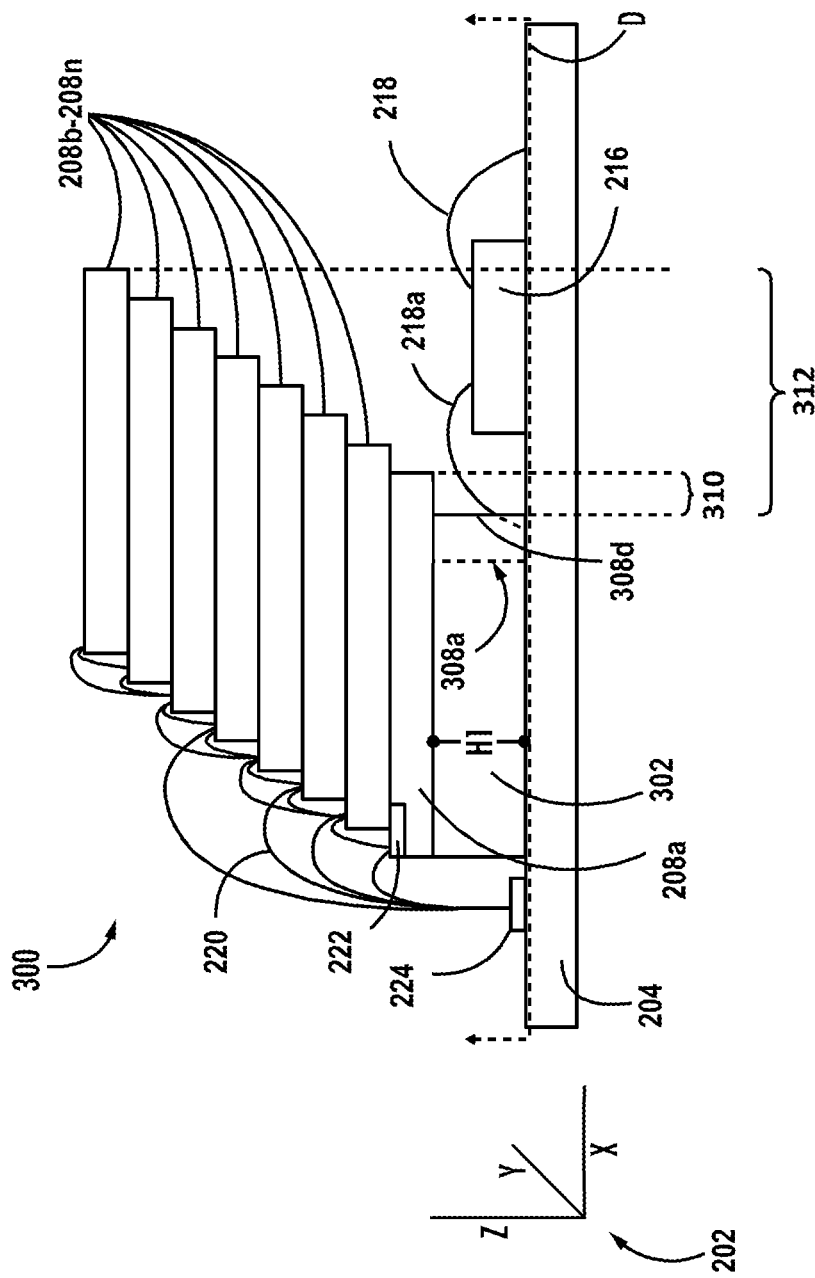

STACKED DIE PACKAGE WITH CURVED SPACER

FIELD OF INVENTION

The present technology relates to semiconductor device assembly and, more particularly, to die spacers.

BACKGROUND

In order to fit more memory in a small package, like other semiconductor devices, memory devices use die stacking. However, die stacking can put pressure on the dies lower in the stack, which could cause die cracking. It would be advantageous to reduce the pressure on the lower dies in a stack to avoid die cracking. It also would be advantageous to be able to locate adjacent dies on a substrate closer to each other.

BRIEF DESCRIPTION OF THE DRAWINGS

FIG. 2b is a cross-sectional side view of the conventional semiconductor device of FIG. 2a;

FIG. 2c is a top view of the conventional semiconductor device of FIG. 2a;

FIG. 3b is a cross-sectional side view of the semiconductor device of FIG. 3a;

FIG. 3c is a top view of the semiconductor device of FIG. 3a;

FIG. 4b is a cross sectional side view of the semiconductor device of FIG. 4a;

FIG. 4c is a top view of the semiconductor device of FIG. 4a;

SUMMARY

Devices, techniques, and systems are disclosed herein that include a substrate, a controller mounted on the substrate, at least one finger electrically connecting the controller die to the substrate, a spacer mounted on the substrate adjacent to the controller die, and a first memory die mounted on the spacer. The spacer has a first curved edge facing the controller die. The first curved edge may have a first curve including a first curve apex extending away from the controller die, a first curve peak located on one side of the first curve apex, and a second curve peak on an opposite side of the first curve apex than the first curve peak.

The at least one finger is connected with the substrate at a bonding point that is vertically aligned with the space between the first curve and a line extending from the first curve peak and the second curve peak. The first curve peak and the second curve peak are each closer to the controller than the first curve apex.

The first curved edge of the spacer may include a second curve that includes a second curve apex extending away from the controller, a third curve peak on one side of the second curve apex, and a fourth curve peak on an opposite side of the second curve apex than the third curve peak.

DETAILED DESCRIPTION

Embodiments of the disclosed subject matter include a spacer in a stacked die package, where the spacer has a curved edge with one or more curves. The spacer is located between a substrate and a bottom die in a stack of dies. It is common for a memory device to include a plurality of memory dies that are stacked. Thus, although the present technology is described with reference to a memory device having a stack of memory dies, it will be apparent to those of skill in the art that the present technology may be applied to semiconductor packaging generally, not just memory devices.

In traditional memory arrays, cracks in non-volatile memory die may be caused, at least in part, by the concentration of stress at the straight edge (i.e., not curved edge) of a spacer placed between a non-volatile memory die and a substrate. The embodiments disclosed herein may reduce such cracks in non-volatile memory dies by, for example, distributing stress along the one or more curves in the curved edge of a spacer.

Figure 1:
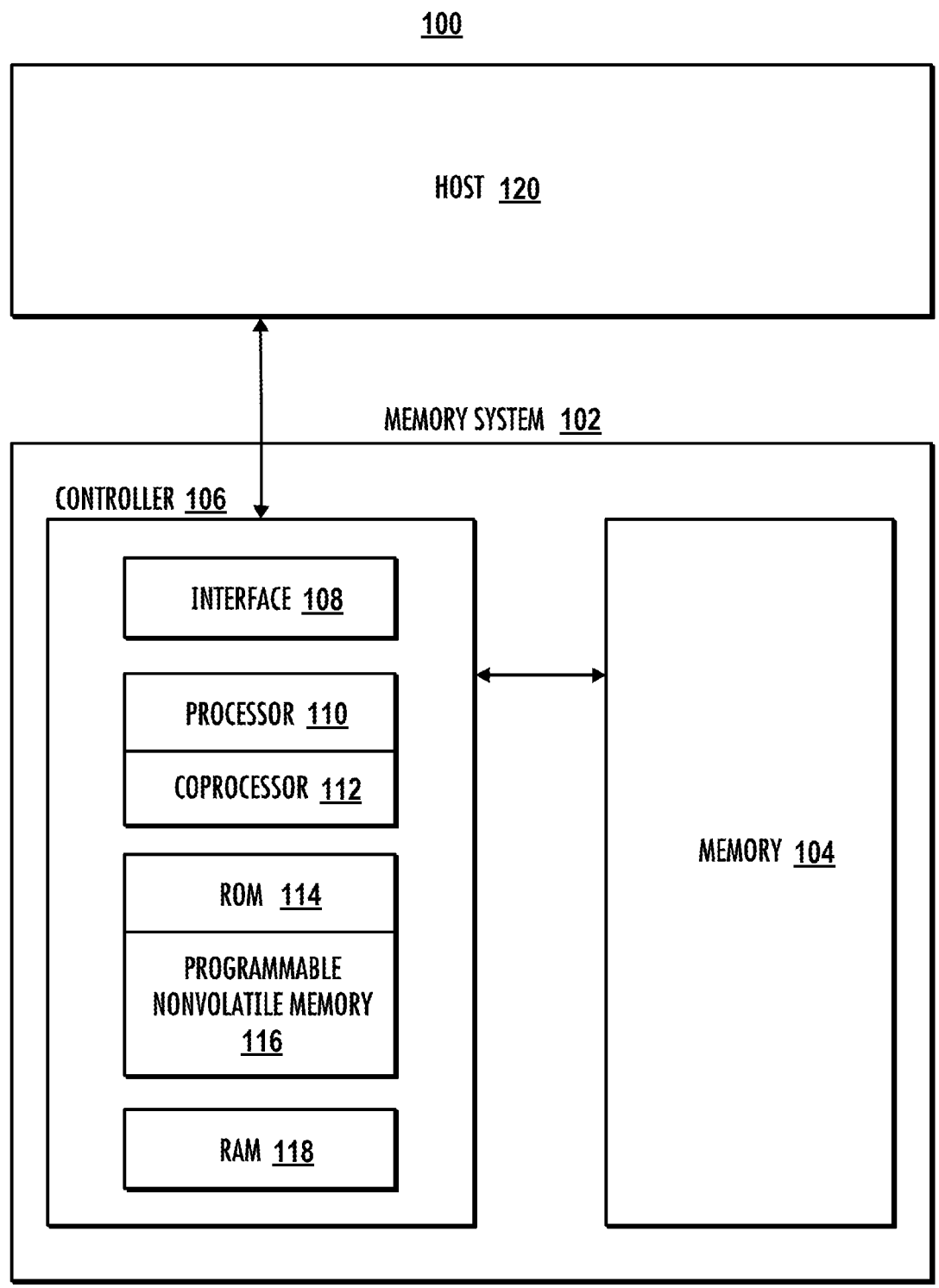
FIG. 1 is a schematic block diagram of a memory system.

FIG. 1 is a schematic illustration of a system 100 including a memory system 102 with hardware components suitable for implementing the techniques disclosed herein. The memory system 102 may be in the form of removable memory such as a memory card or in the form of an embedded memory system. The memory system 102 may include a memory 104 and a controller 106 that controls the operation of the memory 104. The memory 104 may include one or more array of memory cells (e.g., non-volatile memory cells) distributed over one or more integrated circuit chips. The controller 106 may include interface circuits 108, a processor 110, a coprocessor 112, ROM (read-only-memory) 114, programmable nonvolatile memory 116, RAM (random access memory) 118 and additional components, as will be understood by those of skill in the art. The controller 106 may be formed as an ASIC (Application Specific Integrated Circuit) and the components included in such an ASIC may depend on the particular application. The system 100 includes a memory system 102 which may operate with a host 120 through any type of host interface (not shown). It will be understood that the system 100 and/or any of the system's components may include components in addition to those components shown in FIG. 1. It will also be understood that not all the components in FIG. 1's system 100 are necessary to implement the techniques disclosed herein.

With respect to the memory 104, semiconductor memory devices may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. For example, passive semiconductor memory elements may include ReRAM device elements, which may include a resistivity switching storage element, such as an anti-fuse, phase change material, etc., and optionally a steering element, such as a diode, etc. Further, for example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a printed circuit board or substrate may be arranged in two or three dimensions, such as a two-dimensional memory structure or a three-dimensional memory structure.

In a two-dimensional memory structure, the semiconductor memory elements may be arranged in a single plane or a single memory device level. In a two-dimensional memory structure, memory elements may be arranged in a plane (e.g., in an x-z direction plane) which extends substantially parallel to a major surface of the substrate that supports the memory elements. The substrate may be a wafer over or in which the layer of the memory elements is formed, or it may be a carrier substrate which is attached to the memory elements after they are formed.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array may be arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

For example, a three-dimensional memory structure may be vertically arranged as a stack of multiple two-dimensional memory device levels. As another example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two-dimensional configuration, e.g., in an x-z plane, resulting in a three-dimensional arrangement of memory elements with elements on multiple vertically stacked memory planes. Other configurations of memory elements in three dimensions can also constitute a three-dimensional memory array.

As an example, in a three-dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

One or more memory device levels may be formed above a single substrate in a monolithic three-dimensional memory array. Optionally, the monolithic three-dimensional memory array may also have one or more memory layers at least partially within the single substrate. For example, the substrate may include a semiconductor such as silicon. In a monolithic three-dimensional array, the layers constituting each memory device level of the array may be formed on the layers of the underlying memory device levels of the array. However, layers of adjacent memory device levels of a monolithic three-dimensional memory array may be shared or have intervening layers between memory device levels.

Two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry, i.e., the controller 106, may be provided for operation of the memory elements and for communication with the memory elements. For example, as further disclosed herein, memory devices may have circuitry used for controlling and driving memory elements to accomplish functions such as programming and reading.

It will be understood that the following devices and techniques are not limited to the two-dimensional and three-dimensional exemplary structures described above, but to stacked die devices generally.

Figure 2A:
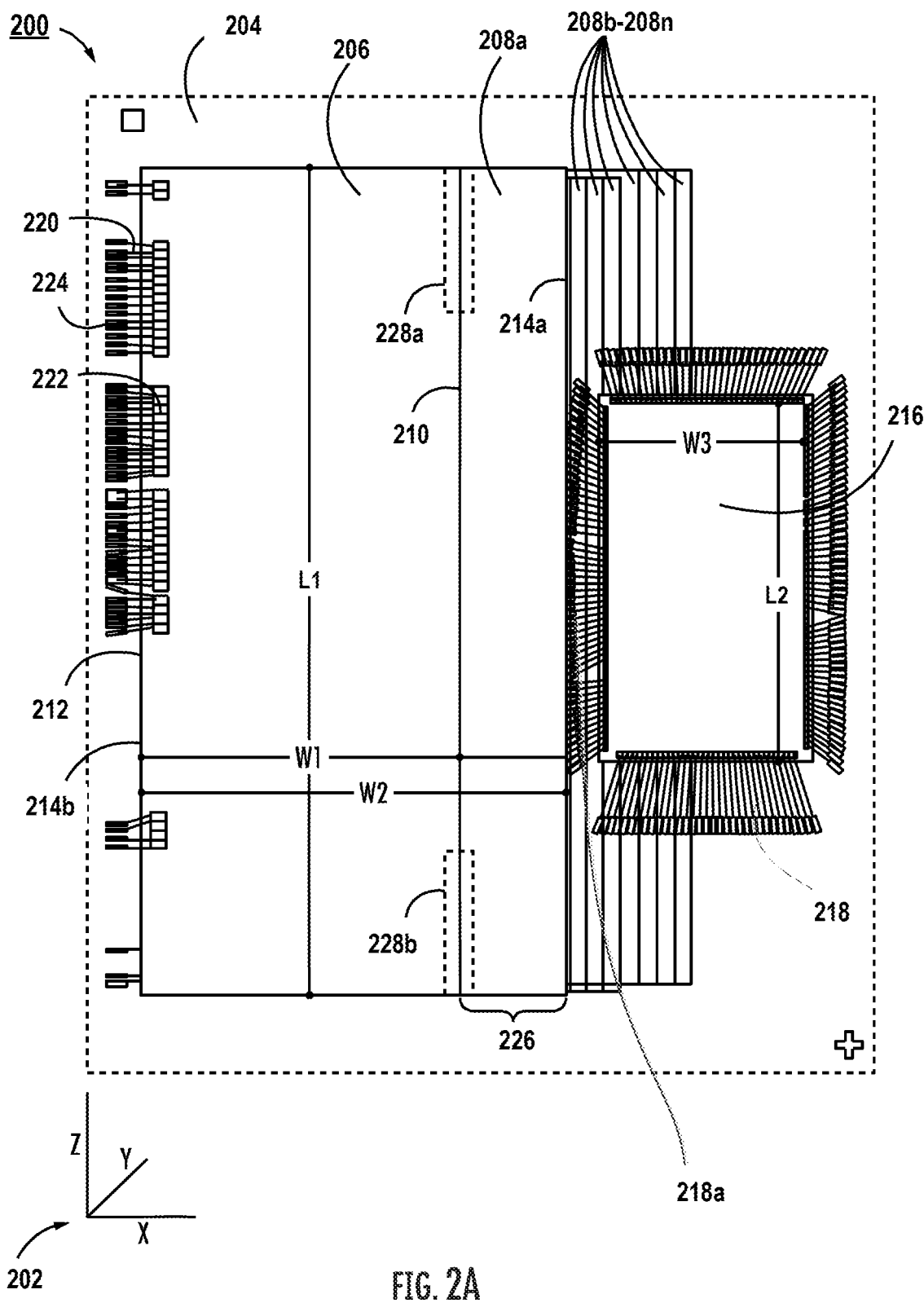
FIG. 2a is a bottom view of a conventional semiconductor device with a spacer including a straight edge.
Figure 2B:
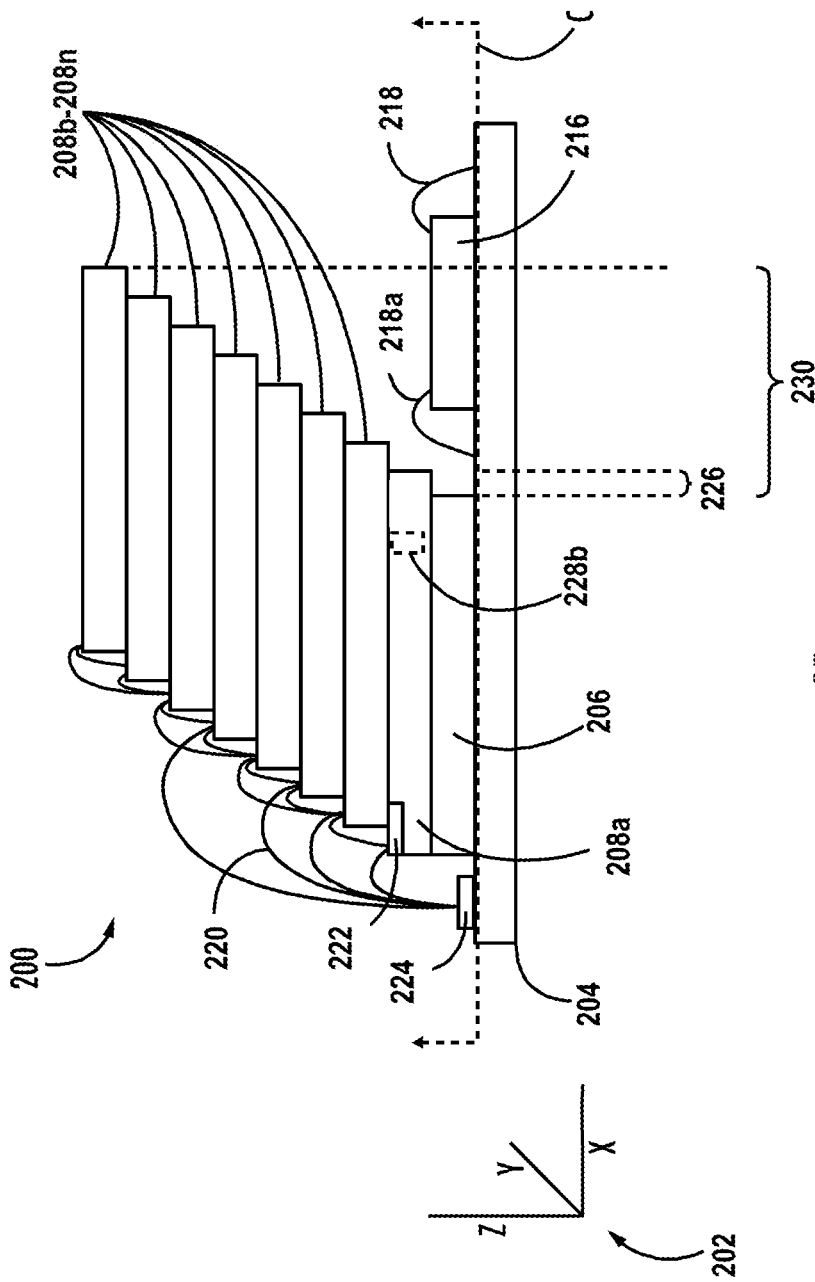

FIGS. 2a and 2b show a bottom view and a side cross-sectional view, respectively, of a conventional three-dimensional NAND memory array 200 which may be part of, for example, memory 104 of FIG. 1. The bottom view shown in FIG. 2a is a cross-section taken directly above, in the Z direction, as indicated by directional axis 202, and shows a substrate 204 as a dashed line. FIG. 2b, on the other hand, is a side cross-sectional view of the conventional memory array 200 over the substrate 204. The bottom view of FIG. 2a is a cross-section of the memory array 200 at dashed line C in FIG. 2b. The substrate 204, which may be a printed circuit board, provides a mounting and interconnect structure for the controller and memory dies.

As shown in FIG. 2a and FIG. 2b, a spacer 206 is provided between the substrate 204 and a first (e.g., bottom) memory die 208a. The spacer 206 has a width W1, from a first edge 210 in the Y-direction to a second edge 212 in the Y-direction, that is less than a width W2 of the first memory die 208a, from a first edge 214a in the Y direction to a second edge 214b in the Y direction, as indicated by directional axis 202. The spacer 206 may be sized to have the same or nearly the same length L1 as the first memory die 208*a* such that the edges of the spacer 206 and the first memory die 208*a* in the X direction, as indicated by the directional axis 202, are approximately flush with each other. As shown in FIG. 2*a* and FIG. 2*b*, the second edge 212 of the spacer 206 is approximately flush with an edge 214*b* of the first memory die 208*a*.

As shown in FIG. 2*a* and FIG. 2*b*, a plurality of additional memory dies 208*b*-208*n*208*n* are stacked on the first memory die 208*a*. The additional memory dies 208*b*-208*n* may be stacked over the first memory die 208*a* in a staggered manner such that each subsequent memory die in the Z direction, as indicated by the directional axis 202, extends past an edge of a given memory die, in the X direction. The staggered configuration of the additional memory dies 208*b*-208*n*, in the Z direction, is readily visible in the cross-sectional side view of FIG. 2*b*.

A controller 216 is mounted on the substrate 204. The controller 216 may be electrically connected to the substrate 204 by a plurality of fingers 218, which may be bond wires. As shown, at least a subset of the fingers 218*a* may extend towards the spacer 206 in the X direction. The controller 216 may have a length L2 and a width W3. According to embodiments, the length L2 of the controller 216 may be less than the length L1 of the spacer 206 and the first memory die 208*a* and the width W3 of the controller 216 may be less than the width W2 of the first memory die 208*a*. However, that is not a requirement and it will be apparent to those of skill in the art that the length and width of the controller may vary.

Each of the memory dies 208 including the first memory die 208*a* and the plurality of additional memory dies 208*b*-208*n* may be electrically connected to the substrate 204 with bond wires 220. The bond wires 220 may connect a plurality of memory die bond pads 222 that are formed along one or more edges of the memory dies 208*a*-208*n* to contact pads 224 on a surface of the substrate 204 that faces the spacer 206. It will be understood that the number of bond wires 220, die bond pads 222, and substrate contact pads 224 may vary based on one or more factors including application, function, design or the like and that the number of bond wires 220, die bond pads 222, and contact pads 224 shown in the figures are examples only. It also will be understood by those of skill in the art that the memory die bond pads 222 (and the controller die bond pads) are shown for ease of understanding the present technology, but actually are as shown in FIG. 2*b*, where active surfaces of the first memory die 208*a* and the controller 216 are not facing the top surface of the substrate 204. Further, although electrical interconnects are shown as bond wires 220, other electrical connection means could be used, for instance using conductive pillars or TSVs (Through Substrate Vias).

Figure 2C:
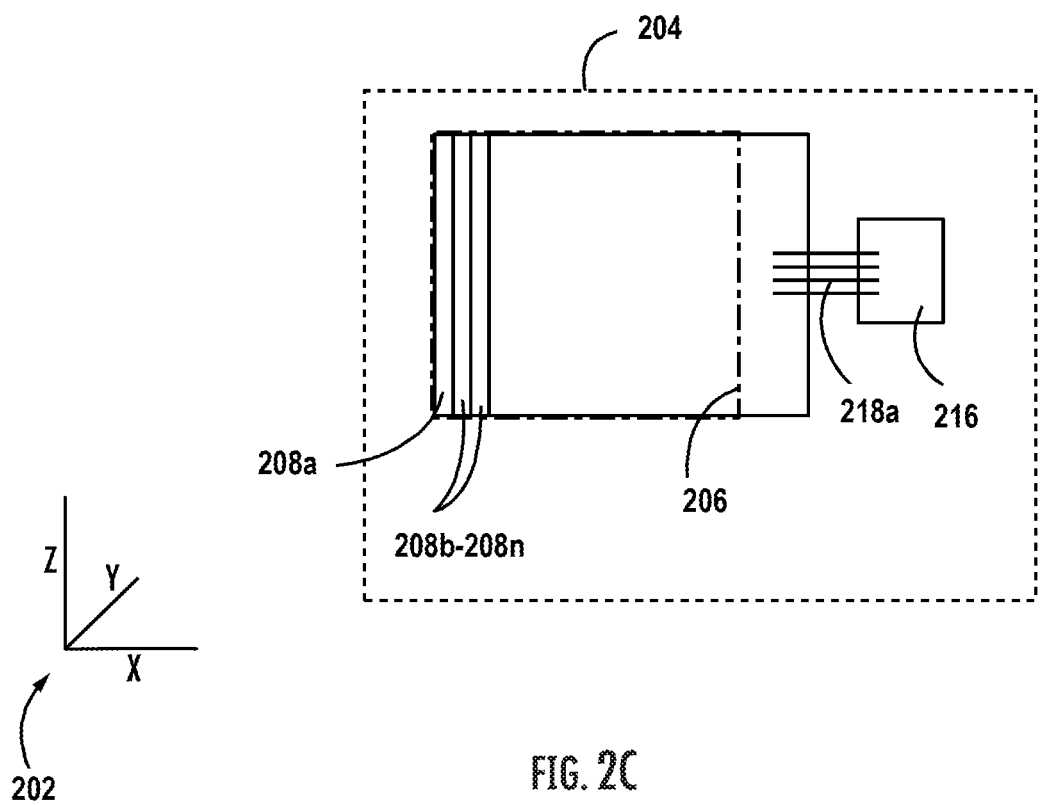

As shown in FIGS. 2*a*-2*c*, the first edge 210 of the spacer 206 may be approximately a straight edge such that extends from one horizontal edge, in the X direction, of the spacer 206 to the other horizontal edge, in the X direction, of the spacer 206 in approximately a straight line. Notably, the width W1 of the spacer 206 may be less than the width W2 of the first memory die 208*a* such that a portion of the first memory die 208*a* extends past the first edge 210 of the spacer 206, towards the controller 216, as indicated by overhang area 226.

In one embodiment, the controller 216 may have a length L2 of approximately 5,510 um and a width W3 of approximately 3,206 um, and the spacer 206 may have a length L1 of approximately 12,175 um and a width W1 of approximately 5,932 um, while the first memory die 208*a* may have a length L1 of approximately 12,175 um and a width W2 of approximately 6,286 um.

It will be understood that the X direction, Y direction, and Z direction, as disclosed herein are for reference purposes only and the embodiments disclosed herein may be implemented using any respective directions.

FIG. 2*c* shows a simplified top view of the conventional stacked die structure provided in FIG. 2*a* and FIG. 2*b*. As shown, the first memory die 208*a* extends furthest towards the X direction away from the controller 216. The additional memory dies 208*b*-208*n* are stacked over the first memory die 208*a* in a staggered configuration, as shown. The fingers 218 electrically connect the controller 216 to the substrate 204. The spacer 206 is shown using dotted lines and is provided below the first memory die 208*a* in the Z direction indicated by directional axis 202.

As shown in FIG. 2*a* and FIG. 2*b*, a portion of the first memory die 208*a* may extend past the first edge 210 of the spacer 206, towards the controller 216, as indicated by overhang area 226. The first edge 210 is a straight edge such that a high amount of stress may be concentrated on the first memory die 208*a* at the location of the straight first edge 210. The high amount of stress at the straight first edge 210 may cause the first memory die 208*a* to crack along the first edge 210 of the spacer 206. The high amount of stress may be a result of the straight configuration of the straight first edge 210 and may be present due to the portion of the first memory die 208*a* that extends past the straight first edge 210 of the spacer 206, towards the controller 216, as indicated by overhang area 226. As an example, the first edge 210 may cause an increased probability of cracking of the first memory die 208*a* at areas 228*a* and/or 228*b*.

The high amount of stress may be concentrated on the first memory die 208*a* at the location of the straight first edge 210 as a result of the weight of the first memory die 208*a* within overhang area 226 as well as the weight of the additional memory dies 208*b*-208*n* that extend past the location of the straight first edge 210 in the X direction. FIG. 2*b* shows an overhang area 230 that corresponds to the portions of the first memory die 208*a* within overhang area 226 as well as the portions of the additional memory dies 208*b*-208*n* that extend past the first edge 210 of the spacer 206. The weight of the first memory die 208*a* within overhang area 226 as well as the portions of the additional memory dies 208*b*-208*n* that extend past the straight first edge 210 (i.e., overhang area 230 which is inclusive of overhang area 226) may be concentrated at the first memory die 208*a* at the location of the straight first edge 210 of the spacer 206, resulting in an increased probability of cracking at this location.

FIGS. 3*a*-3*d* show a memory array 300 including a three-dimensional NAND memory array that includes many of the same components as the three-dimensional NAND memory array 200 of FIGS. 2*a*-2*c*. Accordingly, these same components are not specifically described again.

The memory array 300 includes a spacer 302 located between the bottom or first memory die 208*a* and the substrate 204. The spacer 302 has a straight second edge 304 and first curved edge 306. The first curved edge 306 includes a first curve 308. The first curved edge 306 may mitigate the amount of stress present on the first memory die 208*a* by distributing the weight of the first memory die 208*a*, within area 310, as well as the weight of portions of the additional memory dies 208*b*-208*n* that extend past the first curved edge 306, as indicated by area 312 of FIG. 3*b*. The first curved edge 306 may distribute such weight along a flat region 308d and the first curve 308 of the first curved edge 306 such that the probability of cracking of the first memory die 208a is reduced.

Figure 3A:
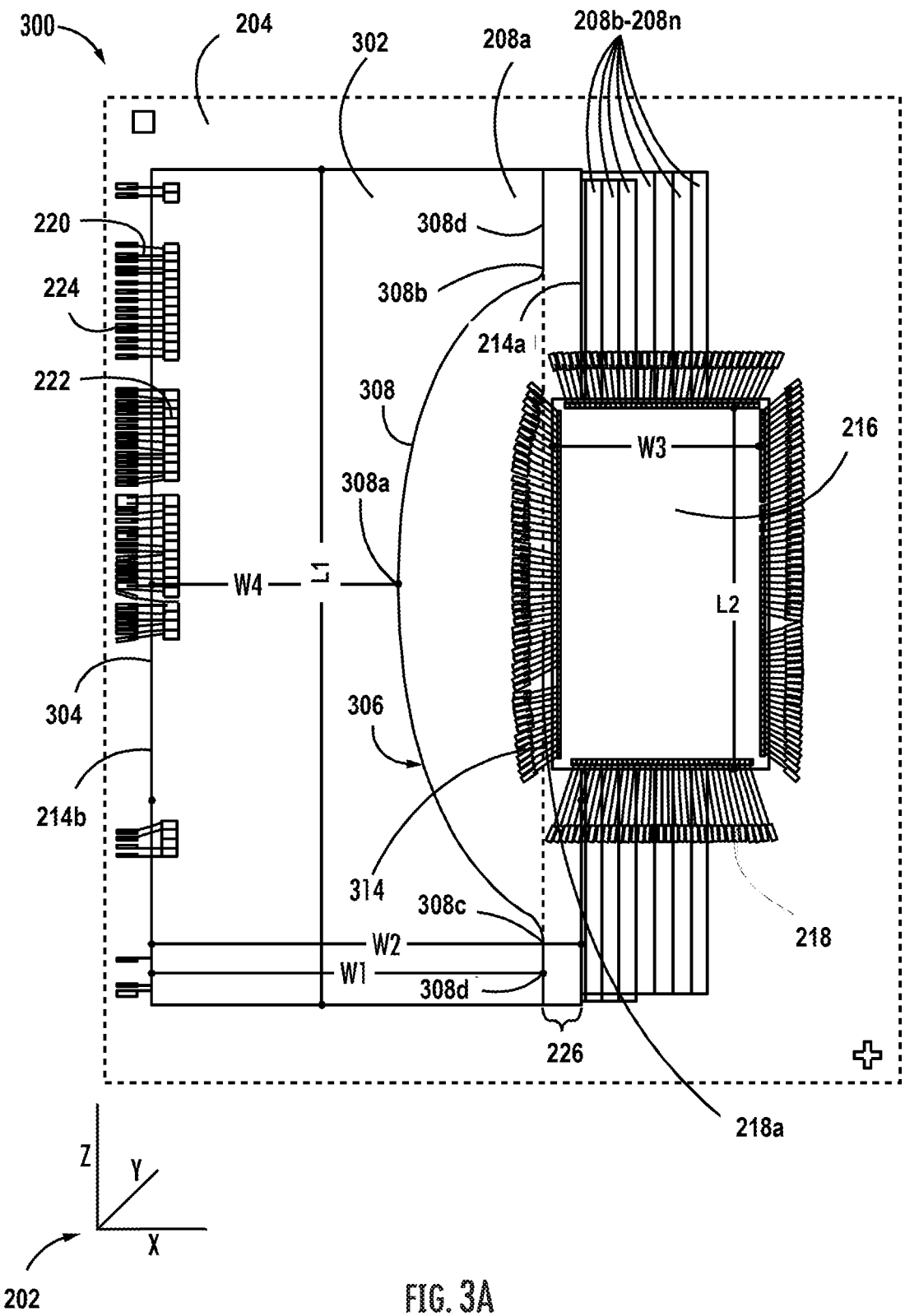
FIG. 3a is a bottom view of a semiconductor device with a spacer including a curved edge.

FIG. 3a shows a bottom view of the memory array 300, which may be part of, for example, memory 104 of FIG. 1. FIG. 3a shows a cross-section taken directly above a substrate 204, which is indicated as a dashed line in FIG. 3a. FIG. 3b shows a side cross-sectional view of the memory array 300 over the substrate 204. The bottom view of FIG. 3a is a cross-section of the memory array 300 at line D of FIG. 3b.

The spacer 302 has the second edge 304 that may be approximately flush with an edge of the first memory die 208a, and the opposing first curved edge 306. The first curved edge 306 has the first curve 308, which has a curve apex at apex point 308a. A width W4 may be measured from the second edge 304 to the apex point 308a. The first curve 308 also has first and second curve peaks 308b and 308c. The first and second curve peaks 308b and 308c may correspond to deflection points where the first curve 308 terminates, as shown in FIG. 3a. According to an embodiment, as shown in FIG. 3a, the first curved edge 306 may include one or more flat regions 308d that extend beyond the first curve peak 308b and the second curve peak 308c, in a direction facing away from the apex point 308a. The width from the second edge 304 of the spacer 302 to the flat regions 308d of the first curved edge 306 of spacer 302 is shown as W1 (i.e., may be the same as the width of the straight edged spacer 206 of FIG. 2a). Alternatively, the width from the second edge 304 to the flat regions 308d of the first curved edge 306 may be a different width where W1 is greater than W4.

The controller 216 is mounted on the substrate 204 and electrically connected to the substrate 204 with a plurality of fingers 218 that connect bond pads on an active surface of the controller 216 with contact pads on the substrate 204. In the embodiment shown, the fingers 218 comprise bond wires. However, other connection means could be used, such as solder balls if the controller 216 were a BGA or QFN type device. As shown, at least a subset of the fingers 218a may extend towards the spacer 302 in the X direction. Similarly, as shown, the first curved edge 306 of spacer 302 faces the controller 216 such that the first and second curve peaks 308b and 308c are each closer to the controller 216 than the apex point 308a.

As shown in FIG. 3a, the first curved edge 306 of spacer 302 may be shaped such that at least a subset of the fingers 218a of the fingers 218 are in connection with the substrate 204 at a bonding point that is vertically aligned with the space between the first curve 308 and a theoretical line 314 extending from the first curve peak 308b and the second curve peak 308c. As a clarifying example, the first curve 308 may have a shape that is similar to a semicircle such that the straight part of the semicircle is represented by the theoretical line 314 and the circular part of the semicircle is represented by the first curve 308 of the first curved edge 306 of the spacer 302. Continuing the example, the subset of the fingers 218a may be electrically connected to the substrate 204 within the area defined by the semicircle, in the X and Y directions. It will be noted that the substrate 204 is in a different plane than the spacer 302 and, thus, the electrical connections between the subset of the fingers 218a and the substrate 204 may be vertically aligned, in the Z direction, with the semicircle.

The spacer 302 may have a height H1, as shown in FIG. 3b, that is greater than the height of the controller 216 and/or the maximum height of the subset of the fingers 218a such that the controller 216 and/or the subset of the fingers 218a may be positioned below the bottom surface of the first memory die 208a. As shown in FIG. 3b, the first curve apex point 308a is further from the controller 216 than the flat region 308d.

Figure 3C:
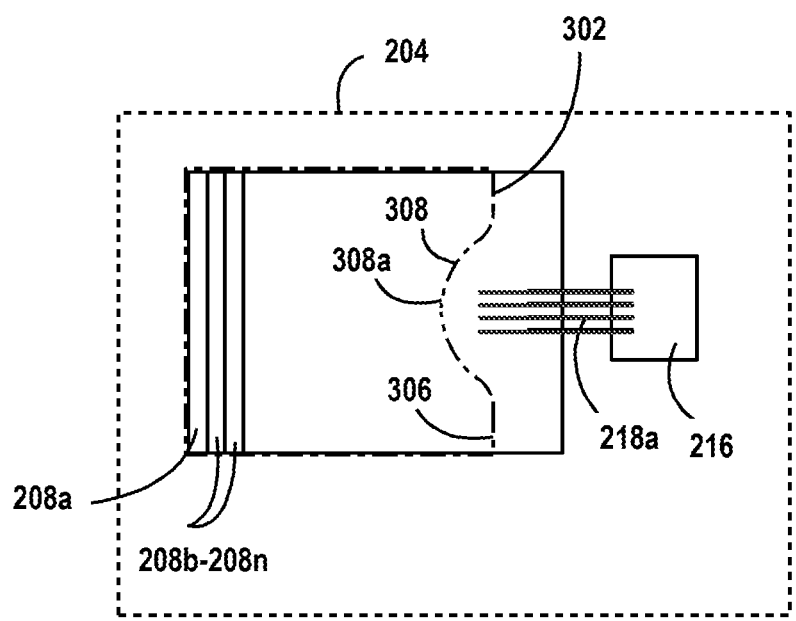

FIG. 3c shows a simplified top view of the memory array 300. As shown, the first memory die 208a extends furthest in the X direction away from the controller 216. The additional memory dies 208b-208n are stacked on the first memory die 208a in a staggered configuration, as shown. The subset of fingers 218a of the fingers 218 connect the controller 216 to the substrate 204 at bonding points that are vertically aligned with the space created by the first curve 308 of the first curved edge 306 of the spacer 302 and a theoretical line 314 created by a first curve peak (not shown in FIG. 3c) and a second curve peak (not shown in FIG. 3c) of the first curved edge 306.

Figure 3D:
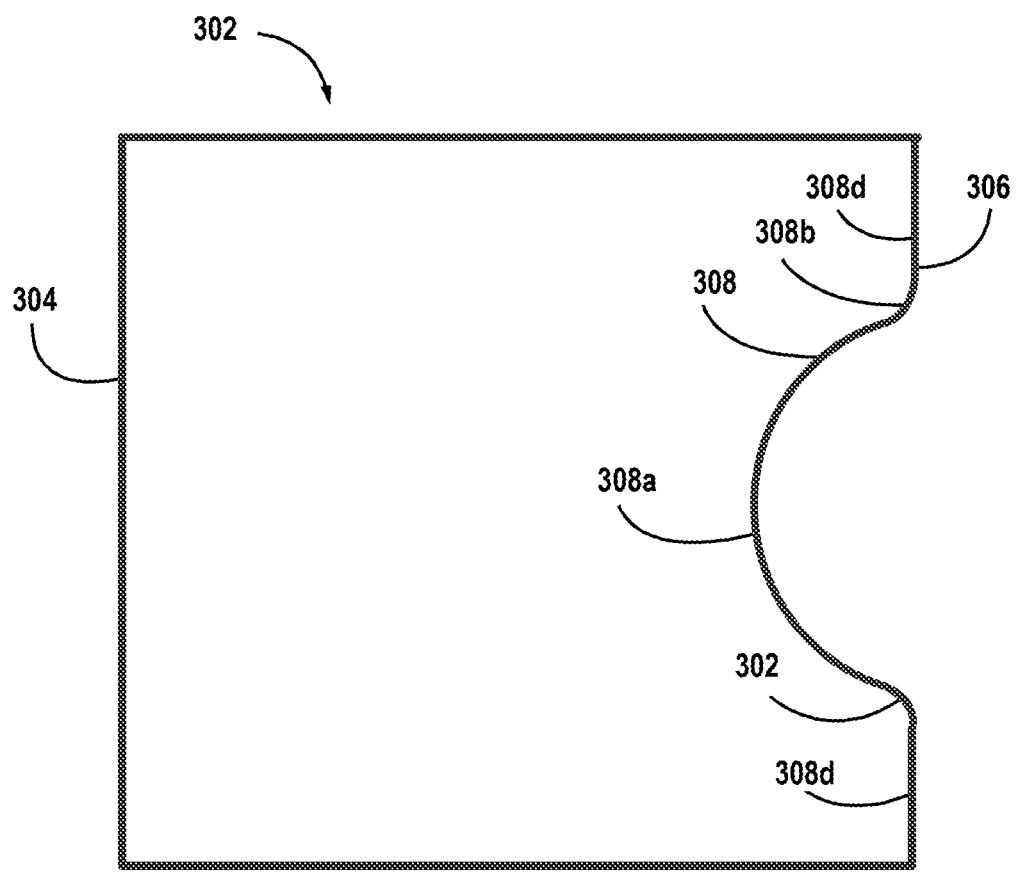
FIG. 3d is a greatly enlarged diagram of a spacer with a curved edge.

FIG. 3d is a greatly enlarged illustration of the spacer 302, which includes the first curved edge 306 and the second edge 304. As shown, the first curved edge 306 includes the first curve 308 with a first apex point 308a, a first curve peak 308b, a second curve peak 308c, and flat regions 308d.

FIGS. 4a-4e show a three-dimensional memory array 400 that includes the same components as the three-dimensional memory array 200 of FIGS. 2a-2c, other than the components specifically recited below. Accordingly, the similar components are not described again.

FIGS. 4a-4e show a memory array 400 that includes a plurality of stacked memory dies 208a-208n, a controller 216, and a spacer 402. In this embodiment, the spacer 402 has a straight second edge 404 and first curved edge 406. The first curved edge 406 includes first and second curves 408 and 410 separated by a center point 412. The first curved edge 406 may mitigate the amount of stress present on the first memory die 208a at the location of the first curved edge 406 by distributing the weight of the first memory die 208a, within area 414, as well as the weight of portions of the additional memory dies 208b-208n that extend past the first curved edge 406, as indicated by area 416 of FIG. 4b. The first curved edge 406 may distribute such weight along the regions 408d and 410d as well as the first and second curves 408 and 410 such that the probability of cracking of the first memory die 208a is reduced.

Figure 4A:
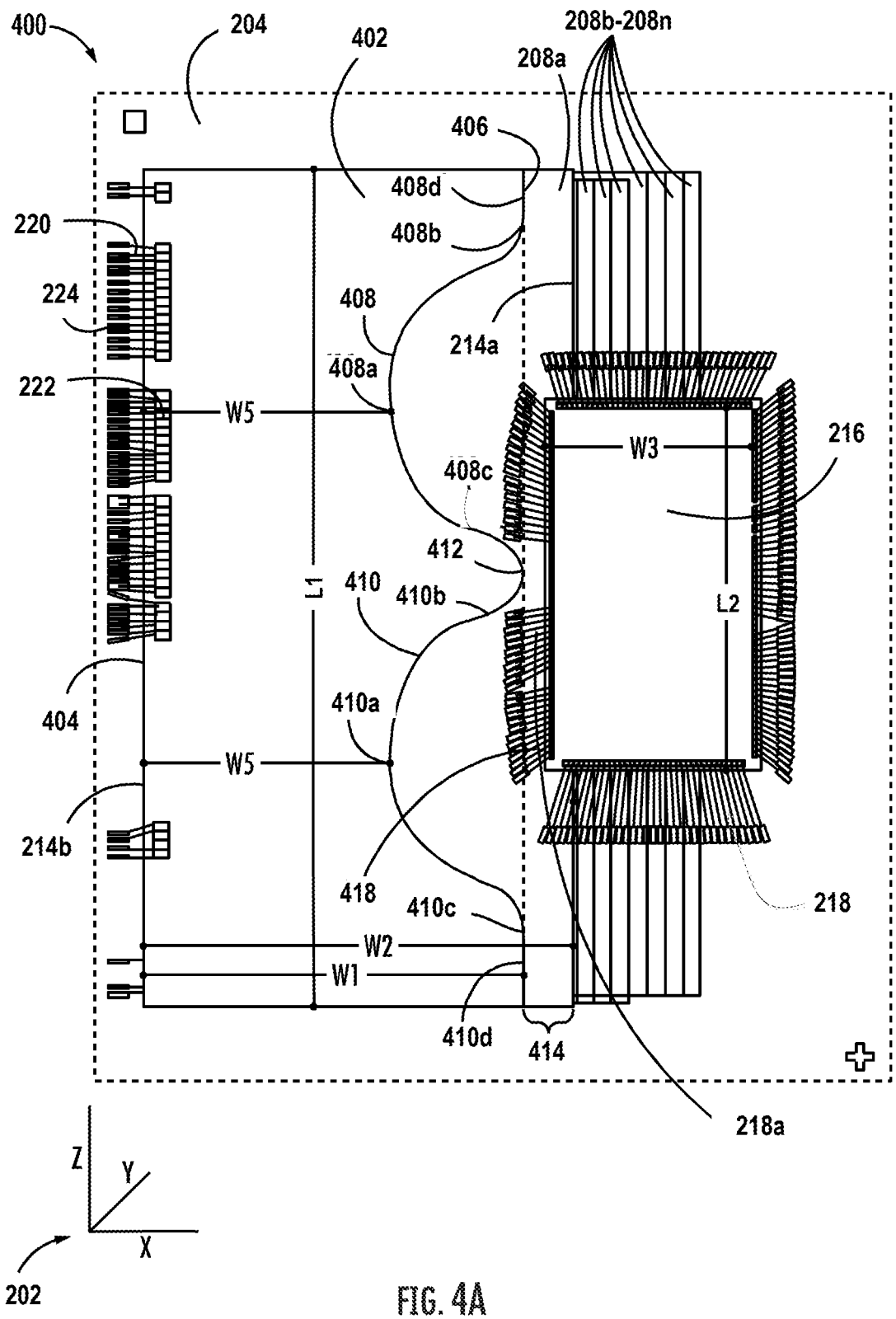
FIG. 4a is a bottom view of a semiconductor device with a spacer including a curved edge with multiple curves.
Figure 4B:
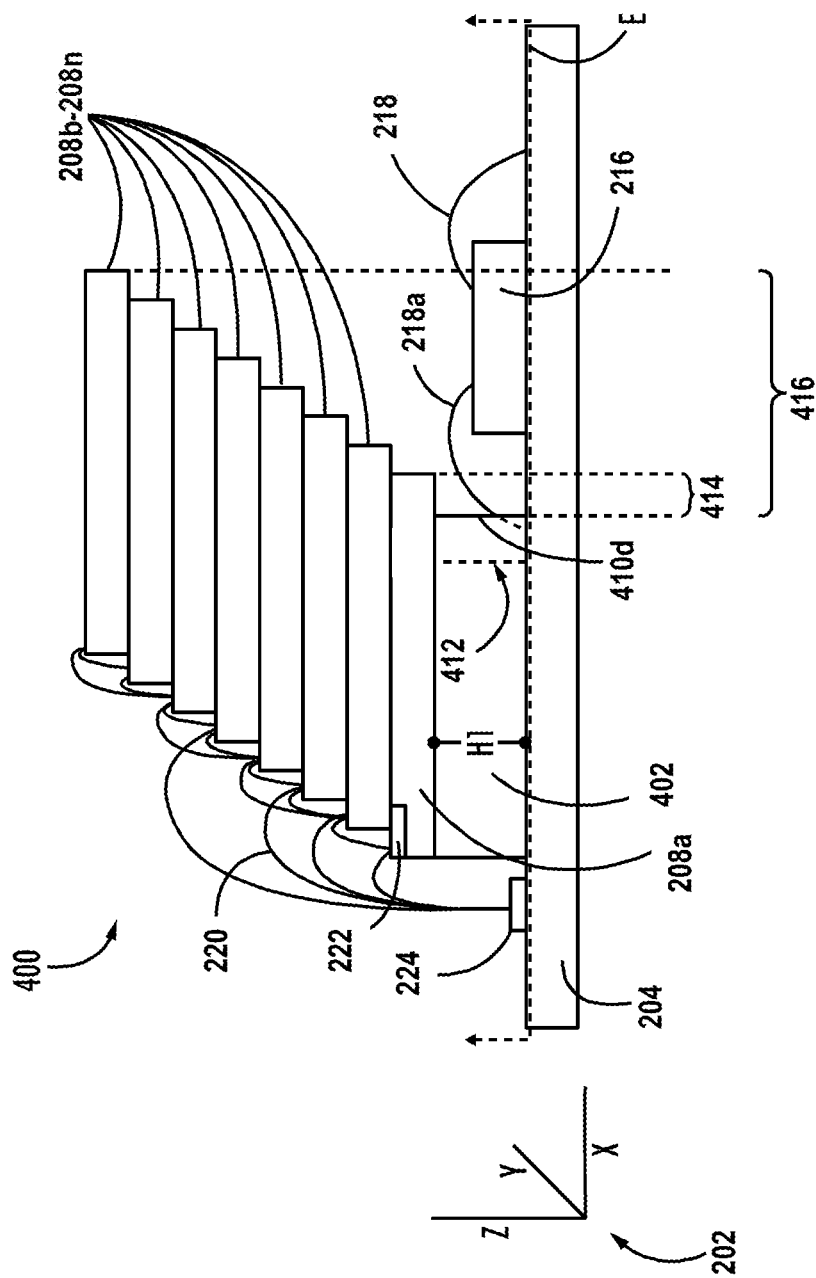

FIG. 4a shows a bottom view of the memory array 400 which may be part of, for example, memory 104 of FIG. 1. FIG. 4a shows a cross section taken directly above a substrate 204 which is indicated as a dashed line in FIG. 4a. FIG. 4b shows a side cross sectional view of the memory array 400 over the substrate 204. The bottom view of FIG. 4a is a cross section of the memory array 400 at line E of FIG. 4b.

The spacer 402 has the second edge 404 that may be approximately flush with an edge of the first memory die 208a and the opposing first curved edge 406. The first curved edge 406 has the first curve 408, which has a curve apex at first apex point 408a and a second curve 410 which has a second apex point at 410a. A width W5 may be measured from the second edge 404 to the first apex point 408a or from the second edge 404 to the second apex point 410a. The first curve 408 has first and second curve peaks 408b and 408c. The second curve 410 has first and second curve peaks 410b and 410c. The first and second curve peaks 408b and 408c of the first curve 408 and the first and second curve peaks 410b and 410c of the second curve 410 may correspond to the deflection points where the first curve 408 and second curve 410 terminate, respectively, as shown in FIG. 4a. According to an embodiment, as shown in FIG. 4a, the first curved edge 406 of spacer 402 may include one or more flat regions 408d and 410d that extend beyond the first curve peak 408b and the second curve peak 410c, in a direction facing away from the apex points 408a and 410a, respectively. The width from the second edge 404 to the flat regions 408d of the first curved edge 406 is shown as W1 (i.e., may be the same as the width of the straight edged spacer 206 of FIG. 2a). Alternatively, the width from the second edge 404 to the flat regions 408d and 410d of the first curved edge 406 may be a different width where W1 is greater than W4. According to an embodiment, the width from the second edge 404 to center point 412 may be W5, where the center point 412 corresponds to the point between the first curve 408 and the second curve 410, as shown in FIG. 4a.

The controller 216 is mounted on the substrate 204, and electrically connected to the substrate 204 with a plurality of fingers 218 that connect bond pads on an active surface of the controller 216 with contact pads on the substrate 204. In the embodiment shown, the fingers 218 comprise bond wires. However, other connection means could be used, such as solder balls if the controller 216 were a BGA or QFN type device. As shown, at least a subset of the fingers 218a may extend towards the spacer 402 in the X direction. Similarly, as shown, the first curved edge 406 of spacer 402 faces the controller 216 such that the first and second curve peaks 408b and 408c and the first and second curve peaks 410b and 410c are each closer to the controller 216 than the apex points 408a and 410a.

As shown in FIG. 4a, the first curved edge 406 of spacer 402 may be shaped such that at least a subset of the fingers 218a of the fingers 218 are in connection with the substrate 204 at a bonding point that is vertically aligned with the space between the first curve 408 and a theoretical line 314 extending from the first curve peak 408b and the second curve peak 408c. Similarly, the first curved edge 406 of spacer 402 may be shaped such that at least a subset of the fingers 218a that bond the controller 216 to the substrate 204 are in connection with the substrate 204 at a bonding point that is vertically aligned with the space between the second curve 410 and a theoretical line 418 extending from the first curve peak 410b and the second curve peak 410c. As a clarifying example, the first curve 408 and/or the second curve 410 may have a shape that is similar to a semicircle such that the straight part of the semicircle is represented by the theoretical line 418 and the circular part of the semicircle is represented by the first curve 408 and/or second curve 410 of the first curved edge 406 of spacer 402. Continuing the example, the subset of the fingers 218a may be electrically connected to the substrate 204 within the area defined by the semicircle created by the first curve 408 and the theoretical line 418 or the second curve 410 and the theoretical line 418, in the X and Y directions. It will be noted that the substrate 204 is in a different plane than the spacer 402 and, thus, the electrical connections between the subset of the fingers 218a and the substrate 204 may be vertically aligned, in the Z direction, with the semicircle created by the first curve 408 and the theoretical line 418 or the second curve 410 and the theoretical line 418.

The spacer 402 may have a height H1, as shown in FIG. 4b, that is greater than the height of the controller 216 and/or the maximum height of the subset of the fingers 218a such that the controller 216 and/or the subset of the fingers 218a may be positioned below the surface of the first memory die 208a. As shown in FIG. 4b, the first curve apex point 408a and the second curve apex point 410a is further from the controller 216 then flat regions 408d and 410d of the first curved edge 406.

Figure 4C:
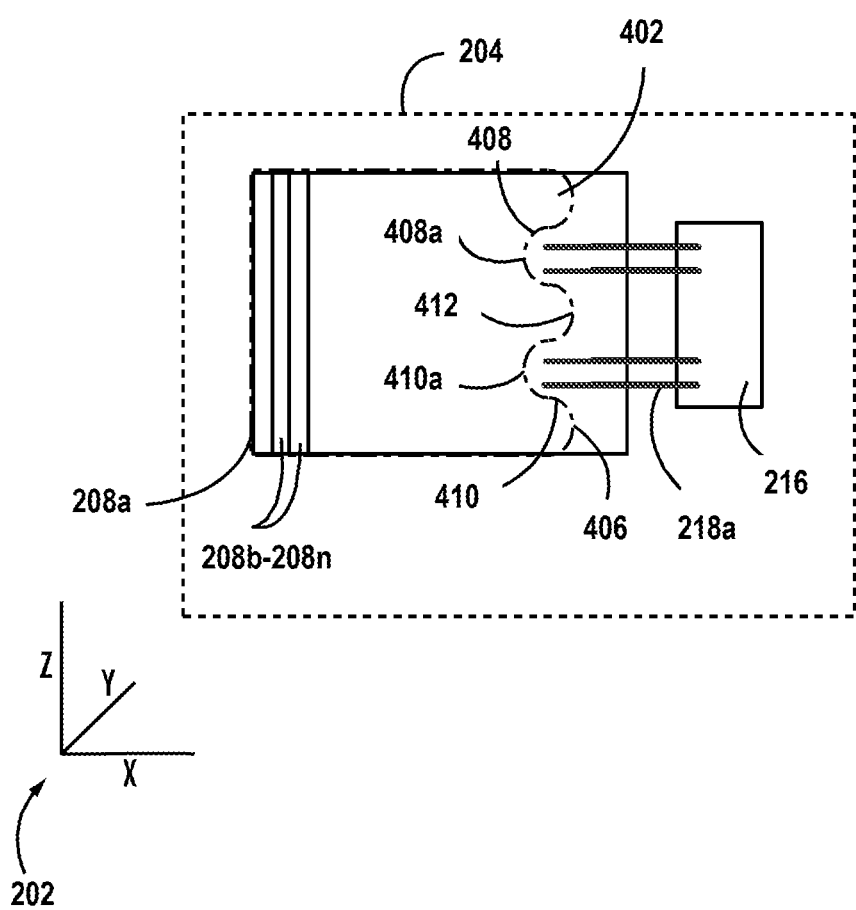

FIG. 4c shows a simplified top view of memory array 400. As shown, the first memory die 208a extends furthest in the X direction away from the controller 216. The additional memory dies 208b-208n are stacked on the first memory die 208a in a staggered configuration, as shown. The subset of fingers 218a of the fingers 218 connect the controller 216 to the substrate 204 at bonding points that are vertically aligned with the space created by the first curve 408 of the first curved edge 406 and a theoretical line 418 created by a first curve peak (not shown in FIG. 4c) and a second curve peak (not shown in FIG. 4c) of the first curve 408. Alternatively, or in addition, the subset of fingers 218a of the fingers 218 connect the controller 216 to the substrate 204 at bonding points that are vertically aligned with the space created by the second curve 410 of the first curved edge 406 and a theoretical line 418 created by a first curve peak (not shown in FIG. 4c) and a second curve peak (not shown in FIG. 4c) of the second curve 410.

Figure 4D:
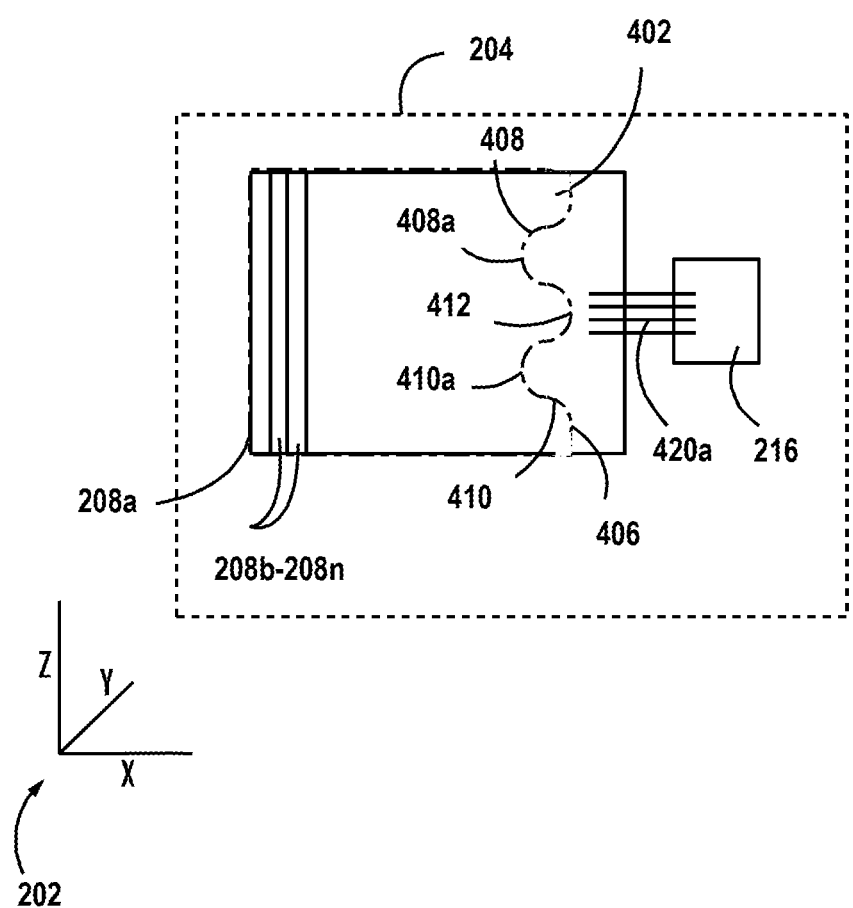
FIG. 4d is another top view of a semiconductor device.

FIG. 4d shows an alternative embodiment of a simplified top view of memory array 400. As shown, the first memory die 208a extends furthest in the X direction away from the controller 216. The additional memory dies 208b-208n are stacked on the first memory die 208a in a staggered configuration, as shown. The fingers 420a connect the controller 216 to the substrate 204 at bonding points that are proximate to the first curved edge 406. Notably, unlike the configuration shown in FIG. 4c, the fingers 420a may not extend into the space created by the first curve and second curve of the first curved edge 406.

Figure 4E:
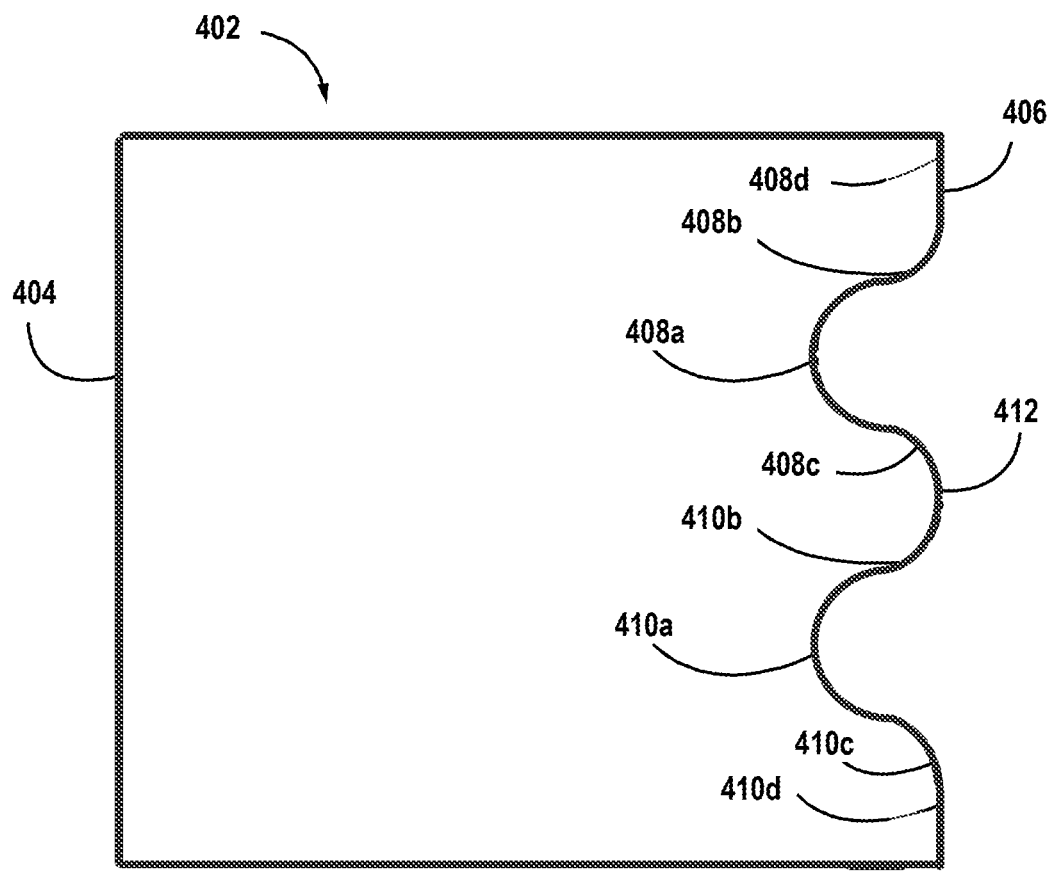
FIG. 4e is another diagram of a spacer with a curved edge.

FIG. 4e shows a simplified version of the spacer 402 which includes a first curved edge 406 and second edge 404. As shown, the first curved edge 406 includes a first curve 408 with a first curve apex point 408a, a first curve peak 408b, a second curve peak 408c, and flat region 408d. The first curved edge 406 also includes a second curve 410 with a second curve apex point 410a, a first curve peak 410b, a second curve peak 410c, and a flat region 410d. A center point 412 corresponds to the point between the first curve 408 and the second curve 410.

Although FIGS. 4a-4e include the spacer 402 that includes two curves (i.e., first curve 408 and second curve 410), it will be understood that a spacer with more than two curves may be provided. The spacers 206, 302 and 402 may be formed from a blank silicon die and/or any other applicable material or a combination of materials.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. A device, comprising:
   a substrate;
   a controller die mounted on the substrate;
   at least one finger electrically connecting the controller die to the substrate;

a spacer mounted on the substrate adjacent to the controller die; and a first memory die mounted on the spacer, wherein the spacer has a first curved edge facing the controller die, the first curved edge having a first curve comprising:

a first curve apex extending away from the controller die;

a first curve peak located on one side of the first curve apex; and a second curve peak on an opposite side of the first curve apex than the first curve peak.

2. The device of claim 1, wherein the at least one finger is in connection with the substrate at a bonding point that is vertically aligned with a space between the first curve and a line extending from the first curve peak and the second curve peak.

3. The device of claim 1, wherein the first memory die overhangs the first curved edge of the spacer, thereby extending past the first curved edge and towards the controller die.

4. The device of claim 3, wherein the first curve peak and the second curve peak are each closer to the controller die than the first curve apex.

5. The device of claim 3, wherein the first curved edge further comprises a second curve comprising:

a second curve apex extending away from the controller die;

a third curve peak; and a fourth curve peak on an opposite side of the second curve apex than the third curve peak.

6. The device of claim 5, wherein the third curve peak and fourth curve peak are each closer to the controller die than the second curve apex.

7. The device of claim 1, wherein the first memory die is electrically connected to the substrate with one or more bond wires.

8. The device of claim 1, wherein the spacer comprises a second straight edge opposite the first curved edge.

9. The device of claim 8, wherein the second straight edge is approximately flush with an edge of the first non-volatile memory die.

10. The device of claim 1, wherein the spacer has a height that is greater than a height of the controller die.

11. The device of claim 1, further comprising a second memory die mounted on the first memory die on a surface of the first memory die that is opposite from the spacer, at least a portion of the second memory die extending past the first memory die towards the controller die.

12. The device of claim 1, wherein a height of the spacer is greater than a maximum height of the finger.

13. The device of claim 1, wherein the first memory die is a NAND memory die.

14. A method of assembling a semiconductor device, comprising:

providing a substrate;

mounting a controller die on the substrate;

electrically connecting the controller die to the substrate with a plurality of first fingers;

attaching a spacer on the substrate adjacent to the controller die, the spacer comprising a first curved edge facing the controller die, the first curved edge having a first curve comprising:

a first curve apex extending away from the controller die;

a first curve peak; and a second curve peak on an opposite side of the first curve apex than the first curve peak;

attaching a first memory die on a top surface of the spacer; and electrically connecting the first memory die to the controller die by way of the substrate with second fingers.

15. The method of claim 14, wherein the second fingers are electrically connected to the substrate at a bonding point that is vertically aligned with a space between the first curve and a line extending from the first curve peak and the second curve peak.

16. The method of claim 14, wherein the first curve peak and the second curve peak are each closer to the controller die than the first curve apex.

17. The method of claim 14, wherein the first curved edge further comprises a second curve comprising:

a second curve apex extending away from the controller die;

a third curve peak; and a fourth curve peak on an opposite side of the second curve apex than the third curve peak.

18. The method of claim 17, wherein the third curve peak and fourth curve peak are each closer to the controller die than the second curve apex.

19. The method of claim 14, further comprising:

attaching a second memory die over the first memory die on a surface of the first memory die that is opposite from the spacer, at least a portion of the second memory die extending past the first memory die towards the controller die; and electrically connecting the second memory die to the first memory die.

* * * * *